(12) United States Patent
Ko et al.

(10) Patent No.: US 8,339,894 B2
(45) Date of Patent: Dec. 25, 2012

(54) ADDRESS DELAY CIRCUIT OF SEMICONDUCTOR MEMORY APPARATUS

(75) Inventors: Jae Bum Ko, Ichon-shi (KR); Jong Chern Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 189 days.

(21) Appl. No.: 12/970,792

(22) Filed: Dec. 16, 2010

(65) Prior Publication Data

US 2011/0242928 A1 Oct. 6, 2011

(30) Foreign Application Priority Data

Mar. 31, 2010 (KR) .................. 10-2010-0029066

(51) Int. Cl.
*G11C 8/06* (2006.01)
(52) U.S. Cl. ............... 365/230.08; 365/194; 365/230.06
(58) Field of Classification Search .................. None
See application file for complete search history.

(56) References Cited

U.S. PATENT DOCUMENTS

| | | | |
|---|---|---|---|
| 5,384,745 A * | 1/1995 | Konishi et al. | 365/230.03 |
| 6,349,072 B1 | 2/2002 | Origasa et al. | |
| 6,590,828 B2 * | 7/2003 | Kim | 365/233.1 |
| 7,529,140 B2 * | 5/2009 | Kim et al. | 365/194 |
| 2002/0048197 A1 | 4/2002 | La | |
| 2008/0056033 A1 | 3/2008 | Jeong | |

FOREIGN PATENT DOCUMENTS

| | | |
|---|---|---|
| JP | 2002-025275 | 1/2002 |
| JP | 2007-066517 | 3/2007 |
| JP | 2009-187670 | 8/2009 |
| KR | 100672128 B1 | 1/2007 |
| KR | 1020070035928 A | 4/2007 |

* cited by examiner

*Primary Examiner* — Tan T. Nguyen
(74) *Attorney, Agent, or Firm* — William Park & Associates Ltd.

(57) ABSTRACT

An address delay circuit of a semiconductor memory apparatus includes a control pulse generation unit configured to generate a control pulse following a time corresponding to a predetermined multiple of cycles of a clock after a read write pulse is inputted; and a delay unit configured to output internal addresses when the control pulse is inputted, wherein the internal addresses are input as external addresses.

16 Claims, 3 Drawing Sheets

ADDRESS DELAY CIRCUIT OF SEMICONDUCTOR MEMORY APPARATUS

CROSS-REFERENCES TO RELATED APPLICATION

The present application claims priority under 35 U.S.C. §119(a) to Korean Patent Application No. 10-2010-0029066, filed on Mar. 31, 2010, in the Korean Intellectual Property Office, which is incorporated herein by reference in its entirety as if set forth in full.

BACKGROUND

1. Technical Field

This disclosure relates to a semiconductor integrated circuit, and more particularly, to an address delay circuit of a semiconductor memory apparatus.

2. Related Art

In general, an address delay circuit of a typical semiconductor memory apparatus receives an external address which is received from an outside, and outputs an internal address.

FIG. 1 is a configuration diagram illustrating a conventional address delay circuit of a semiconductor memory apparatus. The typical address delay circuit of FIG. 1 outputs three external addresses Address<0:2> as three internal addresses Address_dl<0:2> after 5 cycles of a clock CLK elapse.

Referring to FIG. 1, the typical address delay circuit of a semiconductor memory apparatus may include first through fifteenth flip-flops 1 through 15.

The first through fifth flip-flops 1 through 5 may be coupled in series. The first flip-flop 1 may receive a first external address Address<0>, and the fifth flip-flop 5 may output a first internal address Address_dl<0>.

The sixth through tenth flip-flops 6 through 10 may be coupled in series. The sixth flip-flop 6 may receive a second external address Address<1>, and the tenth flip-flop 10 may output a second internal address Address_dl<1>.

The eleventh through fifteenth flip-flops 11 through 15 may be coupled in series. The eleventh flip-flop 11 may receive a third external address Address<2>, and the fifteenth flip-flop 15 may output a third internal address Address_dl<2>. Each of the first through fifteenth flip-flops 1 through 15 may perform inputting, storing and outputting operations in response to the clock CLK.

A problem with conventional address delay circuits is the necessary area and current consumption increase needed as the number of external addresses to be received by a semiconductor memory apparatus increases and a delay time is lengthened. As can be seen from FIG. 1, in the typical address delay circuit of a typical semiconductor memory apparatus, a predetermined number of flip-flops which are coupled in series are needed to delay one external address and output one internal address. In such a type of conventional address delay circuit of a semiconductor memory apparatus, as the number of external addresses to be received by a semiconductor memory apparatus increases and a delay time is lengthened, an increased number of flip-flops are needed, by which a necessary area and current consumption increase.

SUMMARY

Accordingly, there is a need for an address delay circuit of a semiconductor memory apparatus that may obviate the above-mentioned problem. It should be understood, however, that some aspects of the invention may not necessarily obviate the problem.

In the following description, certain aspects and embodiments will become evident. It should be understood that these aspects and embodiments are merely exemplary, and the invention, in its broadest sense, could be practiced without having one or more features of these aspects and embodiments.

In one exemplary embodiment, an address delay circuit of a semiconductor memory apparatus may include: a control pulse generation unit configured to generate a control pulse following a time corresponding to a predetermined multiple of cycles of a clock after a read write pulse is inputted; and a delay unit configured to output internal addresses when the control pulse is inputted, wherein the internal addresses are input as external addresses.

In another exemplary embodiment, an address delay circuit of a semiconductor memory apparatus may include: a control pulse generation unit configured to generate a first control pulse when one cycle of a clock elapses after a read write pulse is inputted and to generate a second control pulse when a predetermined multiple of the one cycle of the clock elapses after the first control pulse is generated; and a delay unit configured to receive and store an external address in response to the first control pulse and output the stored external address as an internal address in response to the second control pulse.

In another exemplary embodiment, an address delay circuit of a semiconductor memory apparatus may include: a first signal storing output unit configured to receive, store and output an external address when one cycle of a clock elapses after a read write pulse is inputted; and a second signal storing output unit configured to output an output of the first signal storing output unit as an internal address when a time corresponding to a predetermined multiple of cycles of the clock elapses after the read write pulse is inputted.

BRIEF DESCRIPTION OF THE DRAWINGS

The accompanying drawings, which are incorporated in and constitute a part of this specification, explain various embodiments consistent with the invention and, together with the description, serve to explain the principles of the invention.

DETAILED DESCRIPTION

Figure 1:
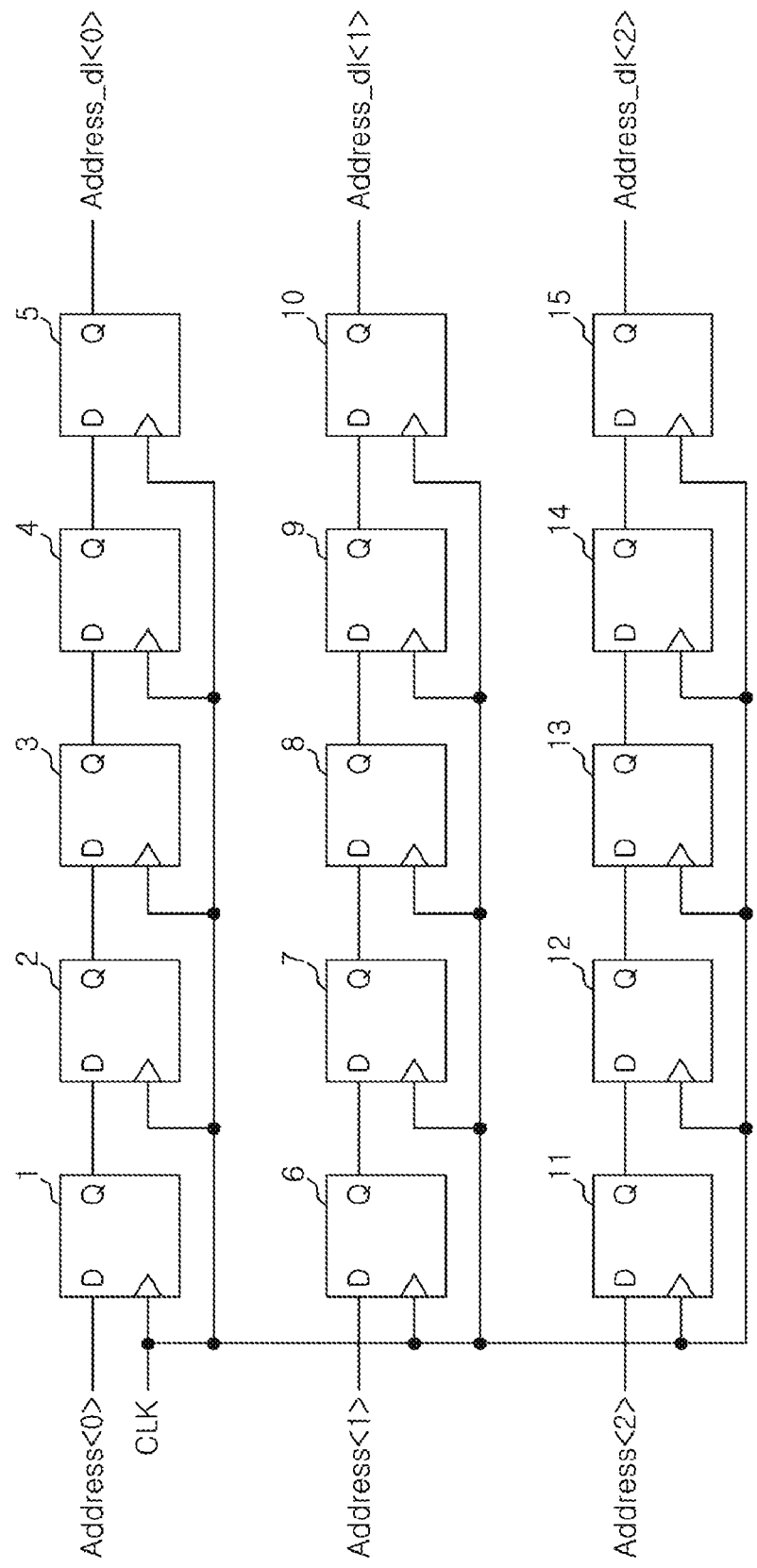
FIG. 1 is a configuration diagram illustrating a conventional address delay circuit of a semiconductor memory apparatus.

Reference will now be made in detail to the exemplary embodiments consistent with the present disclosure, examples of which are illustrated in the accompanying drawings. Wherever possible, the same reference characters will be used throughout the drawings to refer to the same or like parts.

Figure 2:
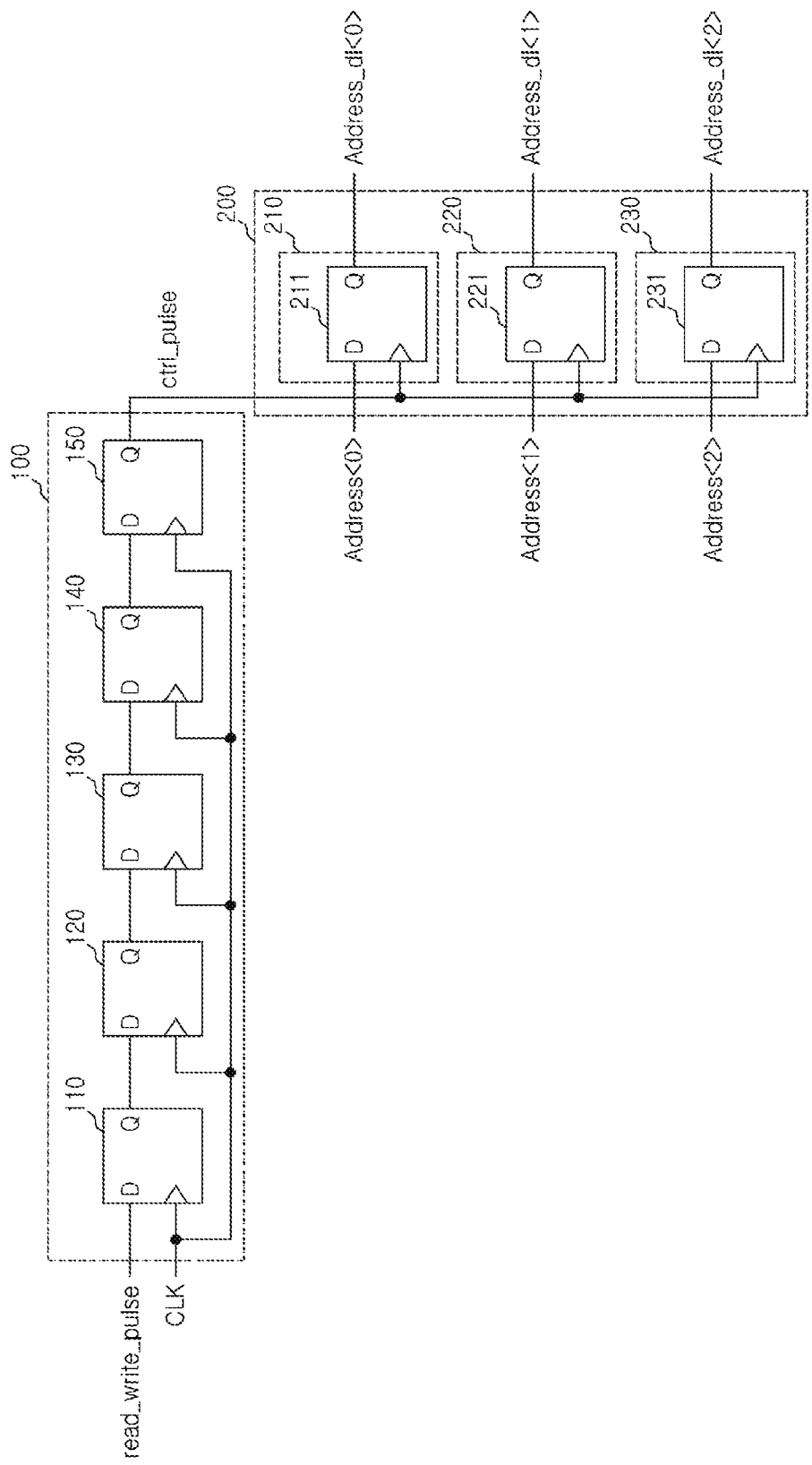
FIG. 2 is a configuration diagram illustrating an address delay circuit of a semiconductor memory apparatus in accordance with an embodiment.

FIG. 2 illustrates an exemplary address delay circuit of a semiconductor memory apparatus which includes a control pulse generation unit 100 and a delay unit 200.

The control pulse generation unit 100 may be configured to generate a control pulse 'ctrl_pulse' when a time corresponding to a predetermined multiple of the cycle of a clock 'CLK' elapses after a read write pulse 'read_write_pulse' is inputted.

For example, the control pulse generation unit 100 may generate the control pulse 'ctrl_pulse' when 5 cycles of the clock 'CLK' elapse after the read write pulse 'read_write_pulse' is inputted. The read write pulse 'read_write_pulse' may be a pulse which is generated when the semiconductor memory apparatus performs a read operation or a write operation.

The control pulse generation unit 100 may include first through fifth flip-flops 110 through 150 which may be coupled in series.

The first flip-flop 110 may have a signal input terminal 'D' which receives the read write pulse 'read_write_pulse' and a clock input terminal which receives the clock 'CLK'.

The second flip-flop 120 may have a signal input terminal 'D' to which an output terminal 'Q' of the first flip-flop 110 is coupled and a clock input terminal which receives the clock 'CLK'.

The third flip-flop 130 may have a signal input terminal 'D' to which an output terminal 'Q' of the second flip-flop 120 is coupled and a clock input terminal which receives the clock 'CLK'.

The fourth flip-flop 140 may have a signal input terminal 'D' to which an output terminal 'Q' of the third flip-flop 130 is coupled and a clock input terminal which receives the clock 'CLK'.

The fifth flip-flop 150 may have a signal input terminal 'D' to which an output terminal 'Q' of the fourth flip-flop 140 is coupled, a clock input terminal which receives the clock 'CLK', and an output terminal 'Q' which outputs the control pulse 'ctrl_pulse'. Accordingly, each of the first through fifth flip-flops 110 through 150 can receive a signal through the signal input terminal 'D' in response to the clock 'CLK', stores the received signal, and can output the stored signal through the output terminal 'Q'.

The delay unit 200 may be configured to receive and store first through third external addresses 'Address<0:2>' in response to the control pulse 'ctrl_pulse' and output those external addresses as first through third internal addresses 'Address_dl<0:2>'.

The delay unit 200 may include first through third delay sections 210 through 230.

The first delay section 210 may be configured to receive and store the first external address 'Address<0>' in response to the control pulse 'ctrl_pulse' and output the first internal address 'Address_dl<0>'.

The first delay section 210 may include a flip-flop 211. The flip-flop 211 has a signal input terminal 'D' which receives the first external address 'Address<0>', a clock input terminal which receives the control pulse 'ctrl_pulse', and an output terminal 'Q' which outputs the first internal address 'Address_dl<0>'.

The second delay section 220 may be configured to receive and store the second external address 'Address<1>' in response to the control pulse 'ctrl_pulse' and output the second internal address 'Address_dl<1>'.

The second delay section 220 may include a flip-flop 221. The flip-flop 221 has a signal input terminal 'D' which receives the second external address 'Address<1>', a clock input terminal which receives the control pulse 'ctrl_pulse', and an output terminal 'Q' which outputs the second internal address 'Address_dl<1>'.

The third delay section 230 may be configured to receive and store the third external address 'Address<2>' in response to the control pulse 'ctrl_pulse' and output the third internal address 'Address_dl<2>'.

The third delay section 230 may include a flip-flop 231. The flip-flop 231 has a signal input terminal 'D' which receives the third external address 'Address<2>', a clock input terminal which receives the control pulse 'ctrl_pulse', and an output terminal 'Q' which outputs the third internal address 'Address_dl<2>'.

The address delay circuit of a semiconductor memory apparatus in accordance with an embodiment configured as mentioned above can operate as follows.

The semiconductor memory apparatus may be configured to store data at a location which can be designated according to an external address inputted from an outside in a write operation, and to output data of a location which can be designated according to an external address in a read operation. Therefore, an address for designating a data location is inputted to the semiconductor memory apparatus from the outside in the read or write operation of the semiconductor memory apparatus.

Thus, the address delay circuit of a semiconductor memory apparatus in accordance with an embodiment has a feature in that an external address is delayed in response to a read write pulse generated in a read or write operation and an internal address is outputted.

Operations of the address delay circuit of a semiconductor memory apparatus in accordance with an exemplary embodiment will be described below with reference to FIG. 2. While FIG. 2 provides an exemplary embodiment of an address delay circuit of a semiconductor memory apparatus which delays the first through third external addresses 'Address<0:2>' by delay times within 5 cycles of the clock 'CLK' and outputs the first through third internal addresses 'Address_dl<0:2>', it is to be noted that the address delay circuit according to the embodiment is not limited by the delay times within 5 cycles of the clock 'CLK' or the number of external addresses. That is, the embodiments of the invention are not limited to the number of external addresses or delay times provided here by means of example.

In the control pulse generation unit 100, when the read write pulse 'read_write_pulse' is inputted and 5 cycles of the clock 'CLK' elapse, the read write pulse 'read_write_pulse' can be outputted as the control pulse 'ctrl_pulse'. More precisely, the control pulse generation unit 100 includes the first through fifth flip-flops 110 through 150 which are coupled in series, and the respective flip-flops 110 through 150 perform inputting, storing and outputting operations in response to the clock 'CLK'. As a consequence, the read write pulse 'read_write_pulse' inputted to the first flip-flop 110 is outputted as the control pulse 'ctrl_pulse' through the fifth flip-flop 150 when 5 cycles of the clock 'CLK' elapse.

The respective first through third delay sections 210 through 230 output the first through third external addresses 'Address<0:2>' as the first through third internal addresses 'Address_dl<0:2>' in response to the control pulse 'ctrl_pulse'.

As a result, the address delay circuit of a semiconductor memory apparatus in accordance with an exemplary embodiment outputs the external addresses as the internal addresses when 5 cycles of the clock elapse after a read write command is inputted to the semiconductor memory apparatus. The external addresses are not changed in the address value thereof during 5 cycles of the clock.

When comparing the conventional address delay circuit of a semiconductor memory apparatus shown in FIG. 1 with the exemplary address delay circuit of a semiconductor memory apparatus shown in FIG. 2, the conventional address delay circuit shown in FIG. 1 has a delay time corresponding to 5 cycles of a clock and needs total 15 flip-flops to delay three external addresses, whereas the address delay circuit according to the embodiment shown in FIG. 2 needs only 8 flip-flops even though it has the same delay time and delays the same number of external addresses as the conventional address delay circuit shown in FIG. 1. Accordingly, in the address delay circuit of a semiconductor memory apparatus in accordance with the exemplary embodiment, even though it has the same delay time and delays the same number of external addresses as in a typical address delay circuit, areal efficiency is improved, and the number of needed flip-flops decrease, by which power consumption can be reduced. Also, while 15 flip-flops operate in response to the clock in the conventional address delay circuit shown in FIG. 1, only 5 flip-flops operate in response to the clock in the address delay circuit in accordance with the exemplary embodiment, by which power consumption can be further reduced.

Figure 3:
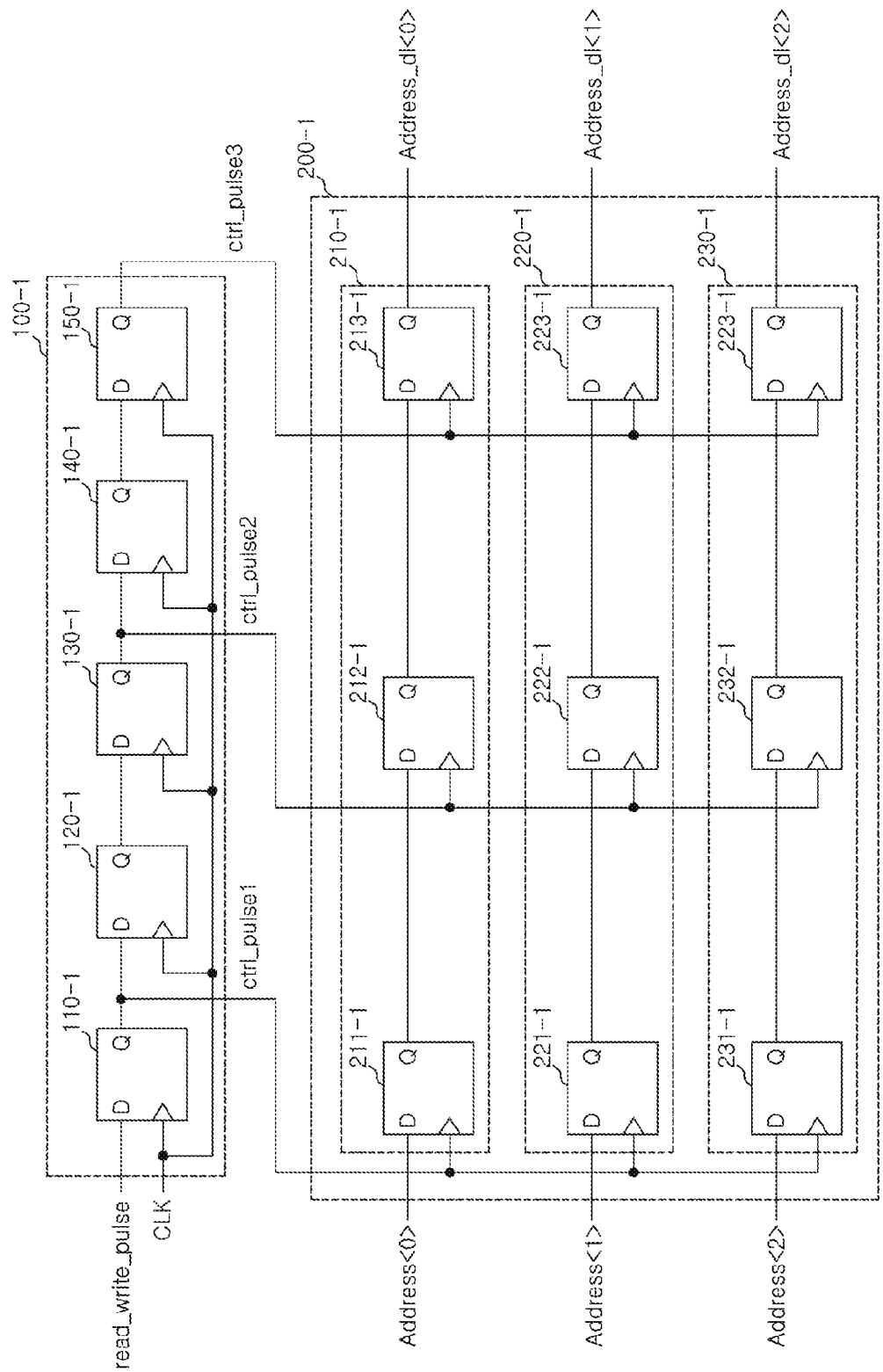
FIG. 3 is a configuration diagram illustrating an address delay circuit of a semiconductor memory apparatus in accordance with another embodiment.

FIG. 3 is an illustration describing an address delay circuit of a semiconductor memory apparatus in accordance with another embodiment, which includes a control pulse generation unit 100-1 and a delay unit 200-1.

The control pulse generation unit 100-1 may be configured to generate a first control pulse ctrl_pulse1 when 1 cycle of a clock 'CLK' elapses after a read write pulse 'read_write_pulse' is inputted, generate a second control pulse 'ctrl_pulse2' when 2 cycles of the clock 'CLK' elapse after the first control pulse 'ctrl_pulse1' is generated, and generate a third control pulse 'ctrl_pulse3' when 2 cycles of the clock 'CLK' elapse after the second control pulse 'ctrl_pulse2' is generated. The read write pulse 'read_write_pulse' is a pulse which is generated when the semiconductor memory apparatus performs a read operation or a write operation.

The delay section 200-1 may be configured to receive, store and output first through third external addresses 'Address<0:2>' in response to the first control pulse 'ctrl_pulse1'. The delay section 200-1 may be configured to receive, store and output the signals outputted according to the first control pulse 'ctrl_pulse1' in response to the second control pulse 'ctrl_pulse2'. The delay section 200-1 may be configured to receive and store the signals outputted according to the second control pulse 'ctrl_pulse2' in response to the third control pulse 'ctrl_pulse3' and output first through third internal addresses 'Address_dl<0:2>'.

The control pulse generation unit 100-1 may include first through fifth flip-flops 110-1 through 150-1 which are coupled in series. The respective flip-flops 110-1 through 150-1 are configured to operate in response to the clock 'CLK'. The output signal of the first flip-flop 110-1 is outputted as the first control pulse 'ctrl_pulse1', the output signal of the third flip-flop 130-1 is outputted as the second control pulse 'ctrl_pulse2', and the output signal of the fifth flip-flop 150-1 is outputted as the third control pulse 'ctrl_pulse3'.

The delay unit 200-1 may include first through third delay sections 210-1 through 230-1.

The respective first through third delay sections 210-1 through 230-1 may be configured to receive, store and output the respective first through third external addresses 'Address<0:2>' in response to the first control pulse 'ctrl_pulse1'. The respective first through third delay sections 210-1 through 230-1 may be configured to receive, store and output the respective signals outputted according to the first control pulse 'ctrl_pulse1' in response to the second control pulse 'ctrl_pulse2'. The respective first through third delay sections 210-1 through 230-1 may be configured to receive and store the respective signals outputted according to the second control pulse 'ctrl_pulse2' in response to the third control pulse 'ctrl_pulse3' and output the respective first through third internal addresses 'Address_dl<0:2>'.

The first delay section 210-1 includes sixth through eighth flip-flops 211-1 through 213-1 which may be coupled in series. The sixth flip-flop 211-1 receives and stores the first external address 'Address<0>' in response to the first control pulse 'ctrl_pulse1' and outputs the stored signal. The seventh flip-flop 212-1 receives and stores the output signal of the sixth flip-flop 211-1 in response to the second control pulse 'ctrl_pulse2' and outputs the stored signal. The eighth flip-flop 213-1 receives and stores the output signal of the seventh flip-flop 212-1 in response to the third control pulse 'ctrl_pulse3' and outputs the stored signal as the first internal address 'Address_dl<0>'.

The second delay section 220-1 includes ninth through eleventh flip-flops 221-1 through 223-1 which may be coupled in series. The ninth flip-flop 221-1 receives and stores the second external address 'Address<1>' in response to the first control pulse 'ctrl_pulse1' and outputs the stored signal. The tenth flip-flop 222-1 receives and stores the output signal of the ninth flip-flop 221-1 in is response to the second control pulse 'ctrl_pulse2' and outputs the stored signal. The eleventh flip-flop 223-1 receives and stores the output signal of the tenth flip-flop 222-1 in response to the third control pulse 'ctrl_pulse3' and outputs the stored signal as the second internal address 'Address_dl<1>'.

The third delay section 230-1 includes twelfth through fourteenth flip-flops 231-1 through 233-1 which may be coupled in series. The twelfth flip-flop 231-1 receives and stores the third external address 'Address<2>' in response to the first control pulse 'ctrl_pulse1' and outputs the stored signal. The thirteenth flip-flop 232-1 receives and stores the output signal of the twelfth flip-flop 231-1 in response to the second control pulse 'ctrl_pulse2' and outputs the stored signal. The fourteenth flip-flop 233-1 receives and stores the output signal of the thirteenth flip-flop 232-1 in response to the third control pulse 'ctrl_pulse3' and outputs the stored signal as the third internal address 'Address_dl<2>'.

The address delay circuit of a semiconductor memory apparatus in accordance with another exemplary embodiment, configured as mentioned above, operates as follows.

When a read or write command is inputted to the semiconductor memory apparatus and a read or write operation is performed, the read write pulse 'read_write_pulse' is generated.

The first control pulse 'ctrl_pulse1' is generated when 1 cycle of the clock 'CLK' elapses after the read write pulse 'read_write_pulse' is inputted to the control pulse generation unit 100-1. The first control pulse 'ctrl_pulse1' may be the output signal of the first flip-flop 110-1.

If the first control pulse 'ctrl_pulse1' is generated, the sixth flip-flop 211-1, the ninth flip-flop 221-1 and the twelfth flip-flop 231-1 receive, store and output the first through third external addresses 'Address<0:2>', respectively. Since the sixth flip-flop 211-1, the ninth flip-flop 221-1 and the twelfth flip-flop 231-1 receive, store and output the signals inputted thereto in response to the output signal of the first flip-flop 110-1, the configuration including the first, sixth, ninth and twelfth flip-flops 110-1, 211-1, 221-1 and 231-1 may be defined as a signal storing output unit.

The second control pulse 'ctrl_pulse2' is generated when 2 cycles of the clock 'CLK' elapse after the first control pulse 'ctrl_pulse1' is generated. The second control pulse 'ctrl_pulse2' is the output signal of the third flip-flop 130-1.

If the second control pulse 'ctrl_pulse2' is generated, the seventh flip-flop 212-1, the tenth flip-flop 222-1 and the thirteenth flip-flop 232-1 receive, store and output the output signals of the sixth flip-flop 211-1, the ninth flip-flop 221-1 and the twelfth flip-flop 231-1, respectively. Since the seventh flip-flop 212-1, the tenth flip-flop 222-1 and the thirteenth flip-flop 232-1 receive, store and output the signals inputted thereto in response to the output signal of the third flip-flop 130-1, the configuration including the third, seventh, tenth and thirteenth flip-flops 130-1, 212-1, 222-1 and 232-1 may be a signal storing output unit.

The third control pulse 'ctrl_pulse3' is generated when 2 cycles of the clock 'CLK' elapse after the second control pulse 'ctrl_pulse2' is generated. The third control pulse 'ctrl_pulse3' is the output signal of the fifth flip-flop 150-1.

If the third control pulse 'ctrl_pulse3' is generated, the eighth flip-flop 213-1, the eleventh flip-flop 223-1 and the fourteenth flip-flop 233-1 receive and store the output signals of the seventh flip-flop 212-1, the tenth flip-flop 222-1 and the thirteenth flip-flop 232-1, respectively, and output the first through third internal addresses 'Address_dl<0:2>'. Since the eighth flip-flop 213-1, the eleventh flip-flop 223-1 and the fourteenth flip-flop 233-1 receive, store and output the signals inputted thereto in response to the output signal of the fifth flip-flop 150-1, the configuration including the fifth, eighth, eleventh and fourteenth flip-flops 150-1, 213-1, 223-1 and 233-1 may be a signal storing output unit.

As a result, the first through third external addresses 'Address<0:2>' are outputted as the first through third internal addresses 'Address_dl<0:2>' when 5 cycles of the clock 'CLK' elapse after the read write pulse 'read_write_pulse' is generated. The first through third external addresses 'Address<0:2>' are not changed in the value thereof during 2 cycles of the clock 'CLK'.

In the address delay circuit of a semiconductor memory apparatus in accordance with an exemplary embodiment even though it has the same delay time and delays the same number of external addresses as in the conventional address delay circuit shown in FIG. 1, a decreased number of flip-flops are needed when compared to the conventional address delay circuit. As a consequence, areal efficiency can be improved and power consumption can be reduced.

While certain embodiments have been described above, it will be understood to those skilled in the art that the embodiments described are by way of example only. Accordingly, the address delay circuit of a semiconductor memory apparatus described herein should not be limited based on the described embodiments. Rather, the address delay circuit of a semiconductor memory apparatus described herein should only be limited in light of the claims that follow when taken in conjunction with the above description and accompanying drawings.

What is claimed is:

1. An address delay circuit of a semiconductor memory apparatus, comprising:
a control pulse generation unit configured to generate a control pulse following a time corresponding to a predetermined multiple of cycles of a clock after a read write pulse is inputted; and
a delay unit configured to output internal addresses when the control pulse is inputted, wherein the internal addresses are input as external addresses.

2. The address delay circuit according to claim 1, wherein the read write pulse is a pulse which is generated when the semiconductor memory apparatus performs a read operation or a write operation.

3. The address delay circuit according to claim 2, wherein the control pulse generation unit comprises flip-flops coupled in series, the number of flip-flops is the same as the predetermined multiple, each of the flip-flops receives, stores and outputs a signal in response to the clock, a flip-flop receives the read write pulse, and a flip-flop outputs the control pulse.

4. The address delay circuit according to claim 1, wherein the delay unit receives and stores the external addresses in response to the control pulse, and outputs the internal addresses.

5. The address delay circuit according to claim 4, wherein the delay unit comprises flip-flops having signal input terminals which receive the external addresses, clock input terminals which receive the control pulse, and signal output terminals which output the internal addresses.

6. The address delay circuit according to claim 4,
wherein the external addresses include a first external address and a second external address,
wherein the internal addresses include a first internal address and a second internal address, and
wherein the delay unit comprises:
a first flip-flop having a signal input terminal which receives the first external address, a clock input terminal which receives the control pulse, and a signal output terminal which outputs the first internal address; and
a second flip-flop having a signal input terminal which receives the second external address, a clock input terminal which receives the control pulse, and a signal output terminal which outputs the second internal address.

7. An address delay circuit of a semiconductor memory apparatus, comprising:
a control pulse generation unit configured to generate a first control pulse when one cycle of a clock elapses after a read write pulse is inputted and to generate a second control pulse when a predetermined multiple of the one cycle of the clock elapses after the first control pulse is generated; and
a delay unit configured to receive and store an external address in response to the first control pulse and output the stored external address as an internal address in response to the second control pulse.

8. The address delay circuit according to claim 7, wherein the read write pulse is a pulse which is generated when the semiconductor memory apparatus performs a read operation or a write operation.

9. The address delay circuit according to claim 8, wherein the control pulse generation unit comprises a plurality of flip-flops which are coupled in series, and each flip-flop receives, stores and outputs an input signal in response to the clock, a flip-flop receives the read write pulse as the input signal and generates the first control pulse, and a flip-flop generates the second control pulse.

10. The address delay circuit according to claim 7,
wherein the delay unit comprises a first flip-flop and a second flip-flop which are coupled in series,
wherein the first flip-flop receives and stores the external address in response to the first control pulse and outputs the stored signal, and
wherein the second flip-flop receives and stores the output of the first flip-flop in response to the second control pulse and outputs the stored signal as the internal address.

11. The address delay circuit according to claim 7,
wherein the external addresses include a first external address and a second external address,
wherein the internal addresses include a first internal address and a second internal address, and
wherein the delay unit comprises:
a first delay section configured to output the first external is address as the first internal address in response to the first and second control pulses; and a second delay section configured to output the second external address as the second internal address in response to the first and second control pulses.

12. The address delay circuit according to claim 11, wherein the first delay section comprises a first flip-flop and a second flip-flop which are coupled in series,
wherein the first flip-flop receives and stores the first external address in response to the first control pulse and outputs the stored signal, and
wherein the second flip-flop receives and stores an output of the first flip-flop in response to the second control pulse and outputs the stored signal as the first internal address.

13. The address delay circuit according to claim 11, wherein the second delay section comprises a first flip-flop and a second flip-flop which are coupled in series,
wherein the first flip-flop receives and stores the second external address in response to the first control pulse and outputs the stored signal, and
wherein the second flip-flop receives and stores an output of the first flip-flop in response to the second control pulse and outputs the stored signal as the second internal address.

14. An address delay circuit of a semiconductor memory apparatus, comprising:
a first signal storing output unit configured to receive, store and output an external address when one cycle of a clock elapses after a read write pulse is inputted; and
a second signal storing output unit configured to output an output of the first signal storing output unit as an internal address when a time corresponding to a predetermined multiple of cycles of the clock elapses after the read write pulse is inputted.

15. The address delay circuit according to claim 14, wherein the first signal storing output unit comprises:
a first flip-flop configured to receive the read write pulse in response to the clock and generate a first control pulse; and
a second flip-flop configured to receive, store and output the external address in response to the first control pulse.

16. The address delay circuit according to claim 15, wherein the second signal storing output unit comprises:
a plurality of third flip-flops coupled in series, an initial third flip-flop among the plurality of third flip-flops receiving the first control pulse and a final third flip-flop among the plurality of third flip-flops generating a second control pulse; and
a fourth flip-flop configured to output an output of the second flip-flop as the internal address in response to the second control pulse.

* * * * *